(12) United States Patent
Watanabe et al.

(10) Patent No.: US 7,825,412 B2
(45) Date of Patent: Nov. 2, 2010

(54) DISPLAY DEVICE

(75) Inventors: Kunihiko Watanabe, Mobara (JP); Junichi Uehara, Mobara (JP); Miyo Ishii, Chiba (JP)

(73) Assignees: Hitachi Displays, Ltd., Chiba-ken (JP); IPS Alpha Technology, Ltd., Chiba-ken (JP)

( * ) Notice: Subject to any disclaimer, the term of this patent is extended or adjusted under 35 U.S.C. 154(b) by 407 days.

(21) Appl. No.: 12/000,854

(22) Filed: Dec. 18, 2007

(65) Prior Publication Data

US 2008/0210941 A1 Sep. 4, 2008

(30) Foreign Application Priority Data

Dec. 21, 2006 (JP) .............................. 2006-343676

(51) Int. Cl.
*H01L 31/14* (2006.01)

(52) U.S. Cl. ...................... 257/59; 257/72; 257/E29.32; 257/E27.131; 257/E27.132; 257/E29.117; 349/42; 349/43

(58) Field of Classification Search ....................... None
See application file for complete search history.

(56) References Cited

U.S. PATENT DOCUMENTS 5,003,356 A * 3/1991 Wakai et al. ................. 257/390

FOREIGN PATENT DOCUMENTS

| JP | 2003-303973 | 4/2002 |
|---|---|---|
| JP | 2005-303119 | 4/2004 |

* cited by examiner

*Primary Examiner*—Minh-Loan T Tran
*Assistant Examiner*—Fei Fei Yeung Lopez
(74) *Attorney, Agent, or Firm*—Stites & Harbison, PLLC; Juan Carlos A. Marquez, Esq.

(57) ABSTRACT

The present invention provides a display device which can obviate the occurrence of a leak current in a thin film transistor. In a display device including a substrate, and gate signal lines, an insulation film, semiconductor layers and conductor layers which are sequentially stacked on the substrate, the conductor layer forms at least a drain electrode which is connected to a drain signal line and a source electrode which is connected to a pixel electrode, and the semiconductor layer is formed in a pattern in which the semiconductor layer has a protruding portion which protrudes outwardly from the conductor layer at a portion thereof except for a distal end of the drain electrode as viewed in a plan view.

7 Claims, 6 Drawing Sheets

DISPLAY DEVICE

The present application claims priority from Japanese application JP2006-343676 filed on Dec. 21, 2006, the content of which is hereby incorporated by reference into this application.

BACKGROUND OF THE INVENTION

1. Field of the Invention

The present invention relates to a display device, and more particularly to a display device which includes a thin film transistor in each pixel.

2. Related Art

This type of display device is configured such that a plurality of pixels is arranged on a display part in a matrix array, each pixel row formed of these pixels is sequentially selected by turning on the thin film transistors provided to the respective pixels in response to scanning signals supplied to the thin film transistors via the gate signal line, and video signals are supplied to the respective pixels of the pixel row via a drain signal line which is connected to corresponding pixels of another pixel row in common at timing of such selection.

With respect to the constitution of such a thin film transistor, there has been known the constitution in which the semiconductor layer, besides a region where the semiconductor is formed, extends to positions below a connecting portion between an electrode of the thin film transistor and the drain signal line respectively.

The thin film transistors having such constitutions can be formed through particular manufacturing steps, for example and, at the same time, due to such constitutions, it is possible to acquire an advantageous effect that the occurrence of a broken step of the drain signal line or the like can be obviated.

Display devices which include the thin film transistors having such constitutions are disclosed in patent document 1 (JP-A-2003-303973) or patent document 2 (JP-A-2005-303119), for example.

However, the display device having the above-mentioned constitution is configured to have a pattern, as viewed in a plan view, in which the semiconductor layer has a portion which projects outwardly from a profile portion defined by a drain electrode and a source electrode of the thin film transistor, a channel region between the drain electrode and the source electrode, the drain signal line, and the connecting portion between the drain signal line and the drain electrode.

Accordingly, for example, there arises a phenomenon that a charge (a carrier) which is generated in the semiconductor layer below the drain signal line due to the radiation of light (light from a back light, for example) to the semiconductor layer below the drain signal line passes the protruding portion of the semiconductor layer and flows into a channel region of the thin film transistor.

That is, the thin film transistor is configured to easily generate leaking of light, and this leaking of light brings about lowering of display characteristics such as crosstalk, brightness irregularities and lowering of contrast.

These drawbacks have been also pointed out by the above-mentioned patent document 1 and patent document 2. To overcome such drawbacks, the technique disclosed in patent document 1 adopts a method which changes a pattern of the semiconductor layer formed by a photolithography technique, and the technique disclosed in patent document 2 adopts a method which makes a surface of the protruding portion of the semiconductor layer coarse.

However, neither patent document 1 nor patent document 2 discloses the formation of the thin film transistor using a registry flow method, the formation of drain electrodes in a particular shape or the like.

SUMMARY OF THE INVENTION

It is an object of the present invention to provide a display device which can obviate the generation of a leak current in a thin film transistor.

To briefly explain typical invention among the inventions described in this application, they are as follows.

(1) The present invention is directed to, for example, a display device which includes a substrate, and gate signal lines, an insulation film, semiconductor layers and conductor layers which are sequentially stacked on the substrate, wherein the conductor layer forms at least a drain electrode which is connected to a drain signal line and a source electrode which is connected to a pixel electrode, and the semiconductor layer is formed in a pattern in which the semiconductor layer has a protruding portion which protrudes outwardly from the conductor layer at a portion thereof except for a distal end of the drain electrode as viewed in a plan view.

(2) The display device according to the present invention is, for example, on the premise of the constitution (1), characterized in that the semiconductor layer is not formed in a protruding manner at least on an edge portion of the distal end of the drain electrode as viewed in a plan view.

(3) The display device according to the present invention is, for example, on the premise of the constitution (1), characterized in that the drain electrode is formed in an approximately U-shaped pattern in which the drain electrode surrounds a distal end portion of the source electrode as viewed in a plan view.

(4) The display device according to the present invention is, for example, on the premise of the constitution (1), characterized in that the drain electrode includes a projecting portion in the vicinity of the distal end portion thereof, and the projecting portion also functions as a connecting portion between the drain electrode and the drain signal line.

(5) The present invention is directed to, for example, a display device which includes a substrate, and gate signal lines, an insulation film, semiconductor layers and conductor layers which are sequentially stacked on the substrate, the conductor layer forms at least a drain electrode which is connected to a drain signal line and a source electrode which is connected to a pixel electrode, the source electrode is formed in a pattern in which the source electrode has a projecting portion at a position where the source electrode overlaps the gate signal line as viewed in a plan view, and the semiconductor layer is formed in a pattern in which the semiconductor layer has a protruding portion which protrudes outwardly from the conductor layer at a portion thereof except for a distal end of the projecting portion as viewed in a plan view.

(6) The display device according to the present invention is, for example, on the premise of the constitution (5), characterized in that the semiconductor layer is not formed in a protruding manner at least on an edge portion of a distal end of the projecting portion as viewed in a plan view.

(7) The present invention is directed to, for example, a display device which includes a substrate, and gate signal lines, an insulation film, semiconductor layers and conductor layers which are sequentially stacked on the substrate, the conductor layer forms at least a drain electrode which is connected to a drain signal line and a source electrode which is connected to a pixel electrode, the source electrode is formed in a pattern in which the source electrode has a projecting portion at a position where the source electrode overlaps the gate signal line as viewed in a plan view, the drain electrode is formed in a pattern in which the drain electrode has a projecting portion at a portion thereof close to a distal end thereof as viewed in a plan view, and the semiconductor layer is formed in a pattern in which the semiconductor layer has a protruding portion which protrudes outwardly from the conductor layer at a portion thereof except for a distal end of the projecting portion of the source electrode and a distal end of the projecting portion of the drain electrode as viewed in a plan view.

(8) The display device according to the present invention is, for example, on the premise of the constitution (7), characterized in that the semiconductor layer is not formed in a protruding manner at least on an edge portion of the projecting portion of the drain electrode as viewed in a plan view.

(9) The display device according to the present invention is, for example, on the premise of the constitution (7), characterized in that the semiconductor layer is not formed in a protruding manner at least on an edge portion of the projecting portion of the source electrode as viewed in a plan view.

(10) The display device according to the present invention is, for example, on the premise of the constitution (7), characterized in that the drain electrode is formed in an approximately U-shaped pattern in which the drain electrode surrounds a distal end portion of the source electrode as viewed in a plan view.

(11) The display device according to the present invention is, for example, on the premise of the constitution (7), characterized in that the projecting portion of the drain electrode also functions as a connecting portion between the drain electrode and the drain signal line.

Here, the present invention is not limited to the above-mentioned constitutions and various modifications are conceivable without departing from the technical concept of the present invention.

The display device having such constitutions can obviate the generation of a leak current in the thin film transistor.

DETAIL DESCRIPTION OF THE PREFERRED EMBODIMENTS

Hereinafter, embodiments of a display device according to the present invention are explained in conjunction with drawings.

Embodiment 1

Figure 2:
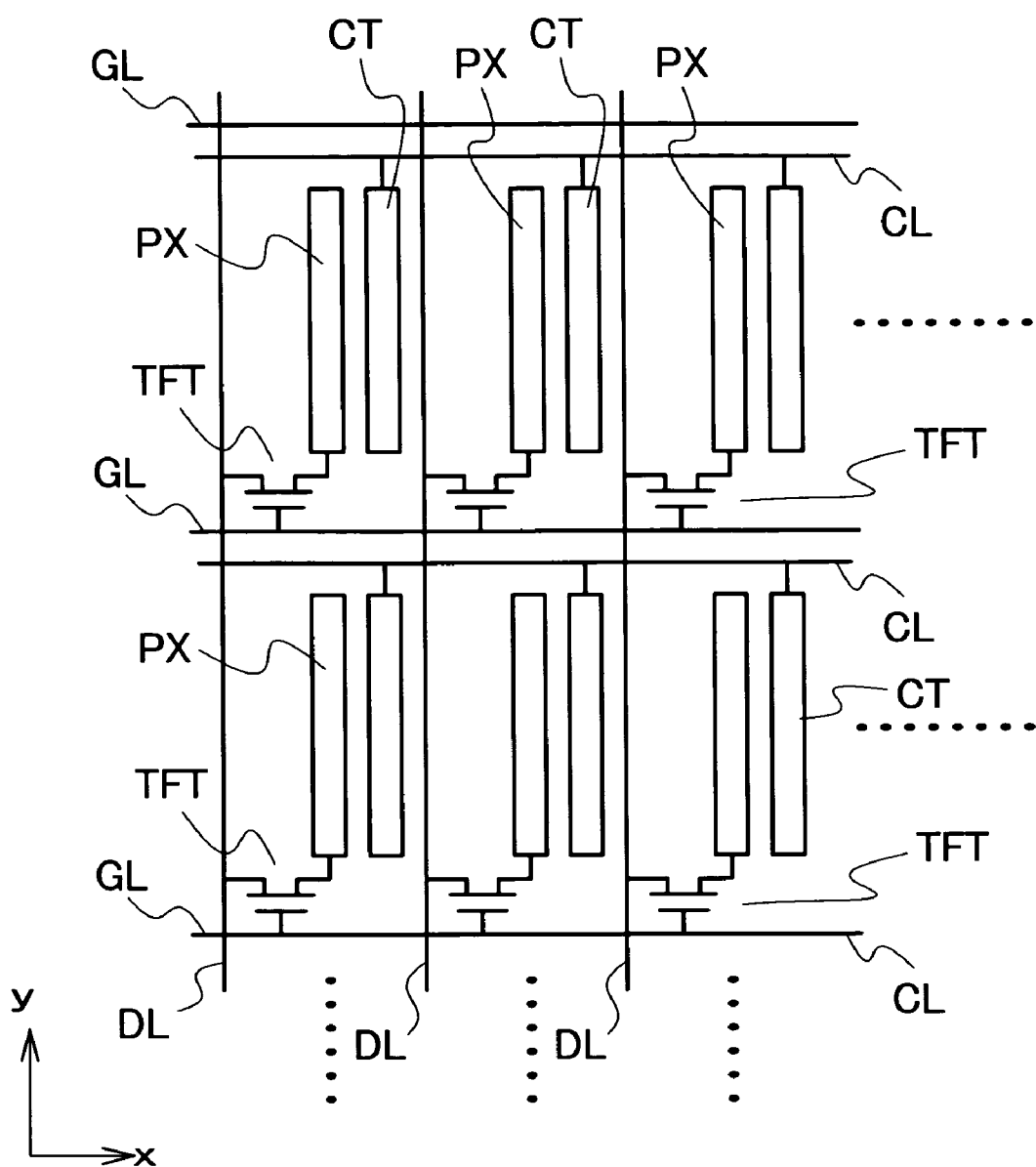
FIG. 2 is an equivalent circuit diagram showing respective pixels of the display device according to the embodiment of the present invention.

In this embodiment 1, a liquid crystal display device is exemplified as a display device according to the present invention, for example. FIG. 2 shows an equivalent circuit of a pixel in a liquid crystal display part of the liquid crystal display device according to the embodiment 1. Further, FIG. 2 is a view showing a circuit which is formed on a liquid-crystal-side surface of one substrate SUB out of respective substrates which are arranged to face each other in an opposed manner with liquid crystal sandwiched therebetween. The circuit includes 6 pixels (=2×3 pixels), for example, which are arranged close to each other.

In FIG. 2, each pixel has a region thereof defined from regions of other neighboring pixels by a pair of neighboring drain signal lines DL which extends in the y direction in the drawing and a pair of neighboring gate signal lines GL which extends in the x direction in the drawing.

Further, at one corner of the pixel, a thin film transistor TFT having the MIS structure is formed. The thin film transistor TFT has a gate electrode thereof connected to a gate signal line GL arranged close to the gate electrode and a drain electrode thereof connected to a drain signal line DL which is arranged close to the drain electrode.

Further, in the region of each pixel, a pair of electrodes consisting of a pixel electrode PX and a counter electrode CT is formed. The pixel electrode PX is connected to a source electrode of the thin film transistor TFT, and the counter electrode CT is connected to a common signal line CL.

In such a circuit constitution, a reference voltage (a voltage which becomes the reference with respect to a video signal) is applied to the counter electrode CT of each pixel via the common signal line CL and a gate voltage is sequentially applied to the gate signal lines GL from an upper side of the drawing, for example, so as to select the pixel row. By supplying a video signal to the respective drain signal lines DL at timing of the selection of the pixel row, a voltage of the video signal is applied to the pixel electrodes PX of the respective pixels of the pixel row via the thin film transistors TFT which are turned on with the gate voltage. Further, a so-called lateral electric field having intensity corresponding to the voltage of the video signal is generated between the pixel electrode PX and the counter electrode CT, and liquid crystal molecules are driven in response to the intensity of the lateral electric field.

In such a circuit, the gate signal lines GL, the drain signal lines DL and the thin film transistors TFT exhibit the substantially same geometrical arrangements. However, for example, the counter electrode CT is formed in a planner shape in most of the region of the pixel, and the pixel electrode PX is constituted of a plurality of strip-shaped electrodes which overlaps the counter electrode CT by way of an insulation film.

Accordingly, a capacitive element which uses the insulation film as a dielectric film is formed between the pixel electrode PX and the counter electrode CT together with the liquid crystal. When a video signal is applied to the pixel electrode PX, the applied video signal is stored in the capacitive element for a relatively long time.

Figure 3A:
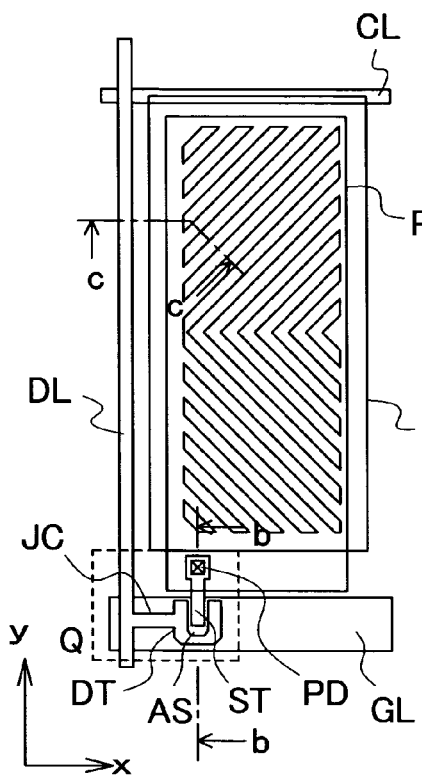
FIG. 3 is a constitutional view of one pixel of the display device according to the embodiment of the present invention.
Figure 3B:
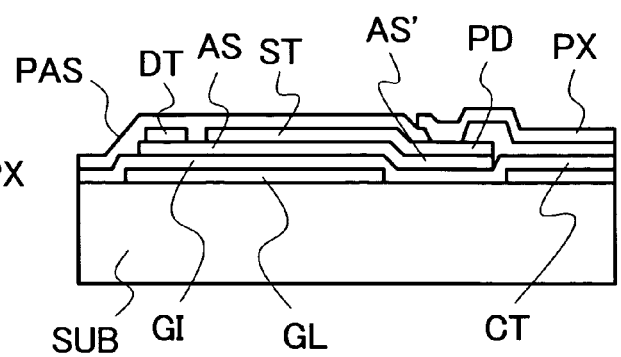
Figure 3C:
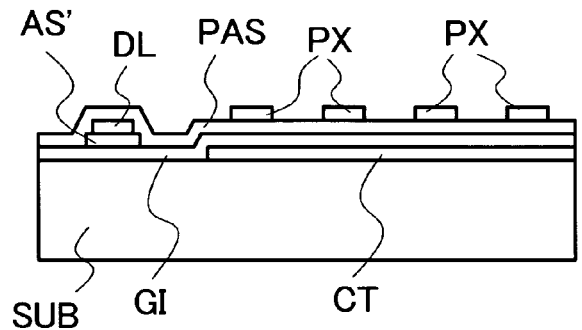

FIG. 3A to FIG. 3C are views showing the constitution of the pixel formed on a liquid-crystal-side surface of the substrate SUB formed of a transparent substrate, for example. The pixel shown in FIG. 3A to FIG. 3C indicates one pixel.

In these drawings, FIG. 3A is a plan view of the pixel, FIG. 3B is a cross-sectional view taken along a line b-b in FIG. 3A, and FIG. 3C is a cross-sectional view taken along a line c-c in FIG. 3A.

First of all, on the liquid-crystal-side surface (front surface) of the substrate SUB, the gate signal line GL and the common signal line CL are formed in parallel to each other with a relatively large distance therebetween.

In a region defined between the gate signal line GL and the common signal line CL, the counter electrode CT made of a transparent conductive material such as ITO (Indium-Tin-Oxide), for example, is formed. The counter electrode CT is formed to overlap the common signal line CL at a common-signal-line-CL-side peripheral portion thereof so that the counter electrode CT is electrically connected with the common signal line CL.

Further, the insulation film GI is formed on the surface of the substrate SUB in a state that the insulation film GI also covers the gate signal line GL, the common signal line CL and the counter electrode CT. The insulation film GI functions as a gate insulation film of the thin film transistor TFT in a region where the thin film transistor TFT described later is formed. A film thickness and the like of the insulation film GI are set in view of such a function.

A semiconductor layer AS made of amorphous silicon, for example, is formed on an upper surface of the insulation film GI at a position where the semiconductor layer AS overlaps a portion of the gate signal line GL. This semiconductor layer AS constitutes the semiconductor layer of the above-mentioned thin film transistor TFT.

Here, although it will become apparent by the explanation made later, the semiconductor layer AS is formed not only in the region where the thin film transistor TFT is formed but also below the drain signal line DL, below a connecting portion JC which electrically connects the drain signal line DL and the drain electrode DT, and below the source electrode ST and the drain electrode DT respectively.

Such a semiconductor layer AS is formed in the above-mentioned pattern by forming the thin film transistor TFT using a so-called registry flow method, for example. In this case, the formation of a stepped portion in the drain signal line DL, for example, can be decreased and hence, it is possible to acquire an advantageous effect that a so-called a broken step defect can be obviated. In the explanation made hereinafter, out of the above-mentioned semiconductor layer AS, the semiconductor layer which is formed in the region other than the region where the thin film transistor TFT is formed may be also indicated by symbol AS'.

The drain signal line DL is formed in an extending manner in the y direction in the drawing, and includes an extending portion which extends toward the thin film transistor TFT side at a portion thereof. The extending portion (connecting portion JC) is connected to the drain electrode DT of the thin film transistor TFT formed on the semiconductor layer AS. Here, the connecting portion JC is formed on the gate signal line GL in an overlapping manner.

Further, the source electrode ST which is simultaneously formed with the formation of the drain signal line DL and the drain electrode DT faces the drain electrode DT on the semiconductor layer AS in an opposed manner and, at the same time, the source electrode ST has an extending portion which slightly extends toward the pixel region side from the semiconductor layer AS. This extending portion constitutes a pad portion PD which is connected with a portion of the pixel electrode PX explained later.

Here, although it will become apparent by the explanation made later, the drain electrode DT is formed in an approximately U-shaped pattern in which the drain electrode DT surrounds a distal end portion of the source electrode ST. Due to such a constitution, it is possible to acquire an advantageous effect that a channel width of the thin film transistor TFT can be increased.

In forming the semiconductor layer AS on the insulation film GI, the semiconductor layer AS is formed with a surface thereof doped with impurity of high concentration, for example. After forming the drain electrode DT and the source electrode ST by patterning using a photoresist film, a shape of the photoresist film is changed by reflowing, and an impurity layer of high concentration which is formed in a region other than regions where the drain electrode DT and the source electrode ST are formed is etched. Due to such an operation, the impurity layer of high concentration remains between the semiconductor layer AS and the drain electrode DT as well as between the semiconductor layer AS and the source electrode ST, and the impurity layer forms an ohmic contact layer.

Due to such steps, as the thin film transistor TFT, the MIS-structure transistor having the so-called inverse staggered structure which uses the gate signal line GL as the gate electrode is formed.

The MIS-structure transistor is driven such that the drain electrode DT and the source electrode ST are changed over in response to applying of a bias. In explaining this embodiment, for the sake of convenience, the electrode on a side connected to the drain signal line DL is referred to as the drain electrode DT, and the electrode on a side connected to the pixel electrode PX is referred to as the source electrode ST.

A protective film PAS is formed on a surface of the substrate SUB in a state that the protective film PAS also covers the thin film transistors TFT. The protective film PAS is provided for preventing the direct contact of the thin film transistor TFT with liquid crystal. Further, the protective film PAS is interposed as a layer between the counter electrode CT and the pixel electrode PX described later and also functions as a dielectric film of the capacitive element formed between the counter electrode CT and the pixel electrode PX along with the above-mentioned insulation film GI.

The pixel electrode PX is formed on an upper surface of the protective film PAS. The pixel electrode PX is made of a transparent conductive material such as ITO (Indium-Tin-Oxide), for example, and is formed on the counter electrode CT in an overlapping manner with a wide overlapping area.

Here, a large number of slits are formed in the pixel electrode PX in parallel in the direction intersecting the longitudinal direction of the pixel electrode PX thus being configured to have a group of electrodes consisting of a large number of strip-shaped electrodes which have both ends thereof connected to each other.

Further, on the surface of the substrate SUB, an orientation film (not shown in the drawing) is formed in a state that the orientation film also covers the pixel electrode PX. This orientation film is provided for setting the initial orientation direction of molecules of liquid crystal which is in direct contact with the orientation film.

With respect to the respective electrodes of the pixel electrode PX are, as shown in FIG. 3A, the region of the pixel is divided in two vertically in the drawing, for example, wherein the respective electrodes in one region are formed to extend in the direction of +45° with respect to the running direction of the gate signal line GL, for example, and the respective electrodes in another region are formed to extend in the direction of −45° with respect to the running direction of the gate signal line GL, for example. That is, the pixel electrode PX adopts a so-called multi-domain method. This method can eliminate a drawback that coloring occurs depending on the viewing direction when the direction of the slits formed in the pixel electrode PX (the direction of the group of electrodes forming the pixel electrode PX) in one pixel is the single direction. Accordingly, it is not always necessary for the pixel electrode PX to adopt such a constitution.

In the above-mentioned embodiment, the semiconductor layer of the thin film transistor TFT is made of amorphous silicon. However, the semiconductor layer of the thin film transistor TFT may be made of poly-silicon.

In the above-mentioned embodiment, the thin film transistor TFT is formed over the gate signal line GL in an overlapping manner by way of the insulation film GI. However, an extending portion may be formed on a portion of the gate signal line GL for forming a gate electrode of the thin film transistor TFT, and the thin film transistor TFT may be formed over the extending portion by way of the insulation film GI. Also in this specification, the gate signal line GL is construed as a member which includes the above-mentioned extending portion.

Figure 1:
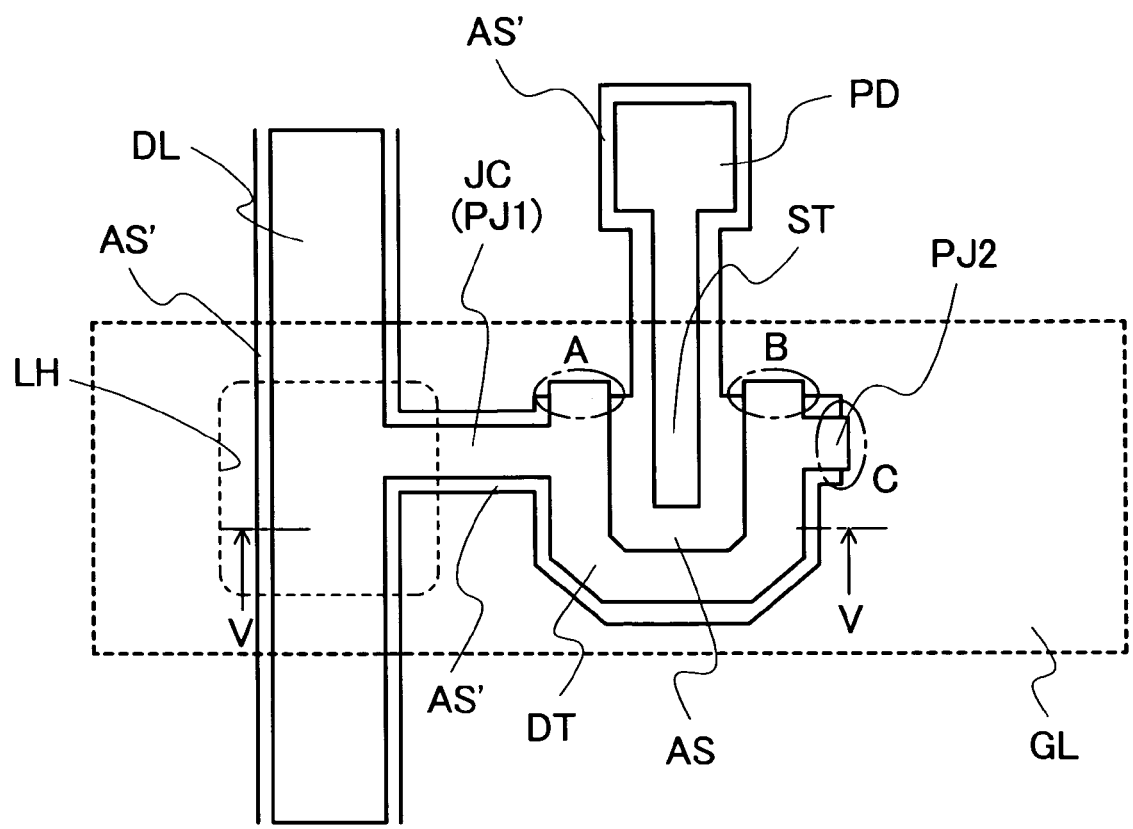
FIG. 1 is a constitutional view of an essential part of a display device according to one embodiment of the present invention.

FIG. 1 is a plan view of the thin film transistor TFT shown in FIG. 3 (a portion indicated by a dotted frame Q in the drawing) in an enlarged manner.

The semiconductor layer AS is formed on an upper surface of the insulation film GI (not shown in the drawing) formed to cover the gate signal line GL.

Here, at an intersecting portion between the gate signal line GL and the drain signal line DL, a though hole LH is formed in the gate signal line GL. Due to such a constitution, a tolerance path with the drain signal line DL is formed into two paths. Assuming that short circuiting occurs between one path and the drain signal line DL, it is possible to perform repairing operation by cutting the path from the gate signal line GL. Accordingly, light from a back light or the like not shown in the drawing is radiated to the semiconductor layer AS via the though hole LH and a charge is liable to be induced in the semiconductor layer AS.

The semiconductor layer AS is formed by selective etching which uses a photo resist film (a deformed photo resist film) having the substantially same shape as the conductor layer formed on an upper surface of the semiconductor layer AS by patterning as a mask. The pattern schematically has the substantially same shape as the conductor layer. The pattern of the semiconductor layer AS is explained later in further detail.

The conductor layer is, first of all, constituted of the drain electrode DT and the source electrode ST of the thin film transistor TFT formed on the semiconductor layer AS which is arranged on the gate signal line GL in an overlapping manner.

The drain electrode DT has an approximately U-shape as viewed in a plan view. That is, the drain electrode DT is formed in a pattern in which two rod-shaped respective conductor layers are arranged in parallel with the longitudinal direction thereof aligned with the y direction in the drawing, and a joining portion CB is formed by joining the respective conductor layers at an end portion of the drain electrode DT on a pixel-region side in a lower portion of the drawing (one end of the drain electrode DT has an opening portion on an upper-pixel-region side in the drawing).

Here, the drain electrode DT is formed along with the formation of the drain signal line DL by performing selective etching of the conductor layer, and is configured to include the connecting portion JC for establishing the electrical connection with the drain signal line DL.

In this case, the connecting portion JC is configured such that the connecting portion JC extends in an overlapping manner with the gate signal line GL and is connected to the drain electrode DT at a portion thereof close to open-ended side of the drain electrode DT.

To observe such a constitution from the drain-electrode-DT side, it is understood that the connecting portion JC is a projecting portion (PJ1) which is formed on a portion of the drain electrode DT close to the above-mentioned one end (distal end) on a side opposite to the source electrode ST.

Further, with respect to one open-ended side of the drain electrode DT which is formed in a U-shaped pattern, at another end of the drain electrode DT on which the connecting portion JC is not formed, a projecting portion PJ2 is formed on a portion close to the above-mentioned one end (distal end) on a side opposite to the source electrode ST. Here, as shown in FIG. 1, it is desirable to form the projecting portion PJ2 at the portion spaced apart from such one open-ended side of the drain electrode DT by a distance substantially equal to a distance from such one open-ended side of the drain electrode DT to the connecting portion JC.

Further, the I-shaped source electrode ST is formed in a state that the source electrode ST is inserted into the U-shaped drain electrode DT from the one open-ended side and extends toward the jointed another end side. Due to such a constitution, the above-mentioned drain electrode DT is, as viewed in a plan view, configured to have a pattern in which the drain electrode DT surrounds a distal end portion of the source electrode ST. A U-shaped channel region is formed on a surface of the semiconductor layer AS on which the drain electrode DT and the source electrode ST face each other in an opposed manner.

The source electrode ST extends toward the pixel region side in an upper portion of the drawing relative to the gate signal line GL while getting over the gate signal line GL, and is connected to the pad portion PD for establishing the connection with the pixel electrode PX not shown in the drawing. The pad portion PD is also formed by selective etching of the conductor layer and is formed together with the source electrode ST.

Further, the semiconductor layer AS is configured to have a projecting portion. This projecting portions lightly extends outwardly not only from a lower region of the conductor layer which constitutes the drain signal line DL, the connecting portion JC, the drain electrode DT, the source electrode ST and the pad portion PD and the channel region defined between the drain electrode DT and the source electrode ST respectively but also from a profile which is defined by these regions along the substantially whole circumference of the profile.

Here, the expression that the protruding portion of the semiconductor layer AS extends outwardly along the "substantially" whole circumference of the profile implies that, at portions of the semiconductor layer AS, the semiconductor layer AS does not project to the outside of the profile but are rather formed in a recessed manner inside the profile. This provision forms the characteristic constitution (pattern) of the semiconductor layer AS of this embodiment.

The characteristic constitution of the semiconductor layer AS is expressed apparently at portions surrounded by chained elliptical frames A, B, C shown in FIG. 1.

That is, the portion indicated by the elliptical frame A is one distal end portion of the open-ended side of the drain electrode DT. In such a distal end portion, the semiconductor layer AS is not formed in an outwardly extending manner with respect to the drain electrode DT, but is formed in an inwardly retracted shape to the contrary. In other words, the distal end portion of the drain electrode DT is configured not to posses a protruding region of the semiconductor layer AS as viewed in a plan view. Further, the distal end portion of the drain electrode DT is formed not to be in contact with the insulation film GI arranged below the semiconductor layer AS.

Further, the portion indicated by the elliptical frame B is another distal end portion of the open-ended side of the drain electrode DT. In such a distal end portion, the semiconductor layer AS is not formed in an outwardly extending manner with respect to the drain electrode DT, but is formed in an inwardly retracted shape to the contrary. In other words, the distal end portion of the drain electrode DT is configured not to possess a protruding region of the semiconductor layer AS as viewed in a plan view. Further, the distal end portion of the drain electrode DT is formed not to be in contact with the insulation film GI arranged below the semiconductor layer AS.

Further, the portion indicated by the elliptical frame C is one distal end portion of the projecting portion PJ2 formed on the drain electrode DT. In such a distal end portion, the semiconductor layer AS is not formed in an outwardly extending manner with respect to the projecting portion PJ2, but is formed in an inwardly retracted shape to the contrary. In other words, the distal end portion of the projecting portion PJ2 is configured not to possess a protruding region of the semiconductor layer AS as viewed in a plan view. Further, the distal end portion of the drain electrode DT is formed not to be in contact with the insulation film GI arranged below the semiconductor layer AS.

Figure 8A:
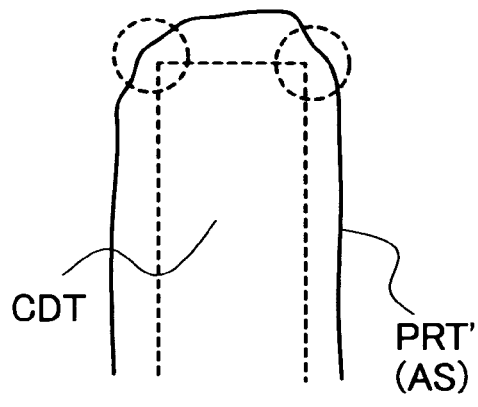
FIG. 8 is an explanatory view showing a profile of a photoresist film in conjunction with the conductor layer when the photoresist film used at the time of performing selective etching of the conductor layer is made to reflow.
Figure 8B:
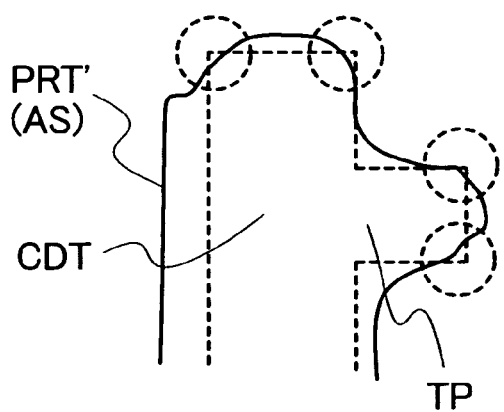

Here, such a semiconductor layer AS is formed due to the following reason. The formation of such a shape makes use of a characteristic of a resist reflow technique. FIG. 8A and FIG. 8B show an example in which a photoresist film PTR after reflowing is formed on a conductor layer CDT. As shown in FIG. 8A, in a distal end portion of the conductor layer CDT having an edge portion (indicated by a dotted circle in the drawing) in profile, the photoresist film PTR is not expanded in the same manner as the conductor layer CDT in shape. That is, there exists tendency that the photoresist film PTR' is not remarkably expanded in an edge portion but is largely expanded in a straight portion. FIG. 8B shows a shape of the photoresist film PTR when a projecting portion TP is combined to the conductor layer CDT so that the number of edge portions (indicated by a dotted circle in the drawing) is increased. When the photoresist film PTR has the shape shown in FIG. 8B, due to the presence of the projecting portion TP, a profile line of the conductor layer CDT is increased and hence, a quantity of the photoresist film PTR which expands to the circumference is decreased. Particularly, this tendency is conspicuous at the edge portions of the conductor layer CDT so that the protrusion of the photoresist film PTR is eliminated.

Such a characteristic is conspicuously generated when the projecting portion TP is arranged close to the distal end portion of the conductor layer CDT and hence, it is possible to surely form the regions where the photoresist film PTR is not protruded by adjusting the position of the projecting portion TP.

The present invention is made by focusing on such a characteristic. That is, by making use of the shape of the projecting portion TP, it is possible to form the regions where the photoresist film PTR (=semiconductor layer AS) does not protrude from the conductor layer CDT.

Figure 4A:
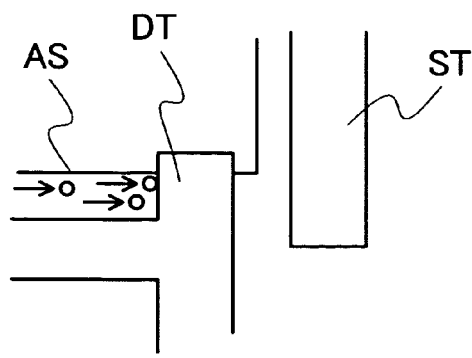
FIG. 4A and FIG. 4B are explanatory views showing an advantageous effect acquired by a thin film transistor of the display device of the present invention.
Figure 4B:
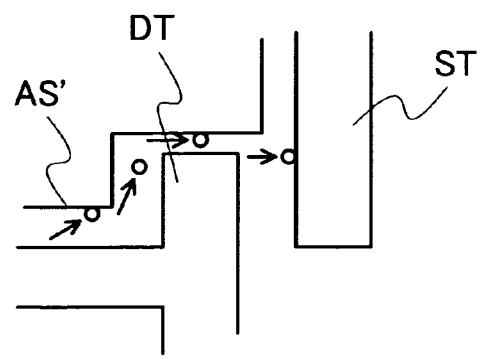

What is important with the present invention is the formation of the semiconductor layer AS which does not protrude from the conductor layer CDT in predetermined regions of the thin film transistor TFT. FIG. 4A and FIG. 4B are views which show peripheries of the drain electrode DT and the source electrode ST shown in FIG. 1 in an enlarged manner. As shown in FIG. 4A, each distal end of the drain electrode DT on the open-ended side can separate the semiconductor layers AS which are present on both sides of the edge portion constituting a boundary electrically and in plane. Accordingly, even when carriers (indicated by white dots in the drawing) are generated in the semiconductor layer AS below the drain signal line DL due to the radiation of light from a backlight not shown in the drawing, for example, an inflow path of the carriers into the channel region of the thin film transistor TFT is terminated at a portion of the distal end of the drain electrode DT and hence, the generation of a leak current can be obviated.

For a reference purpose, FIG. 4B shows an example which is not conscious of the separation of the semiconductor layer AS. In the drawing, carriers (indicated by white dots in the drawing) are leaked to the source electrode ST side via the semiconductor layer AS.

This embodiment is characterized by the utilization of the characteristic shown in FIG. 8. That is, in the vicinity of the distal end portion of the drain electrode DT, the connecting portion JC (PJ1) with the drain signal line DL and the projecting portion PJ2 are formed with the constitution substantially equal to the constitution of the projecting portion TP shown in FIG. 8. The positions where the connecting portion JC (PJ1) and the projecting portion PJ2 are formed are surely adjusted to positions which are capable of forming regions in which the semiconductor layer AS does not protrude from the drain electrode DT.

Here, in the constitution shown in FIG. 1, at each distal end of the U-shaped drain electrode DT on the open-ended side, either one of the connection portion JC (PJ1) and the projecting portion PJ2 is configured to project from the semiconductor layer AS. However, the projecting portion on only the distal end on the side which is connected to the drain signal line DL may be configured to project from the semiconductor layer AS (that is, the projecting portion PJ2 shown in FIG. 1 being configured not to project). This is because it is considered that the drain electrode DT on the side positioned remote from the drain signal line DL is only slightly influenced by carriers generated in the semiconductor layer AS' below the drain signal line DL.

FIG. 5A to FIG. 5F are step views of a manufacturing method of the display device according to one embodiment of the present invention showing a portion of the thin film transistor TFT. The respective step views shown in FIG. 5A to FIG. 5F indicate a cross section taken along a line V-V in FIG. 1. The manufacturing method is explained in order of steps in conjunction with FIG. 5A to FIG. 5F.

Figure 5A:
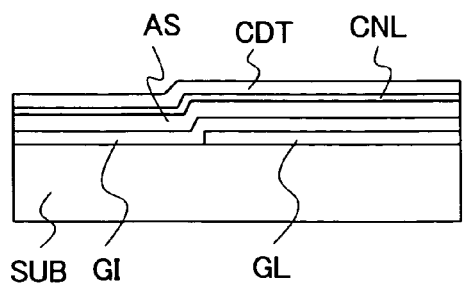
FIG. 5A to FIG. 5F are views showing steps of manufacturing method of the display device according to the embodiment of the present invention.

Firstly, as shown in FIG. 5A, the substrate SUB which forms the gate signal line GL and the insulation film GI on a main surface (liquid-crystal-side surface) thereof is prepared. Here, the insulation film GI also covers the gate signal line GL.

On a whole area of an upper surface of the insulation film GI formed on the substrate SUB, the semiconductor layer AS and the conductor layer CDT are sequentially stacked using a CVD method, for example.

Here, the semiconductor layer AS is made of amorphous Si, for example, and a surface of the semiconductor layer AS is doped with n-type impurity of high concentration thus forming a high concentration impurity layer CNL. This high-concentration impurity layer CNL functions as an ohmic contact layer of the thin film transistor TFT.

Figure 5D:
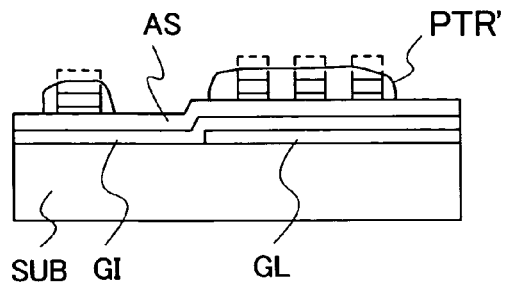
Figure 5B:
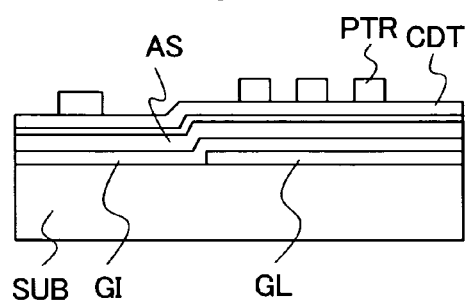

Next, as shown in FIG. 5B, a photoresist film is applied to a whole area of a surface of the conductor layer CDT, and the photoresist film is pattered by selectively removing the photoresist film using a well-known photolithography technique.

Here, a pattern of the remaining photoresist film PTR is substantially equal to a pattern of the conductor layer CDT which is expected to remain by selective etching.

Figure 5E:
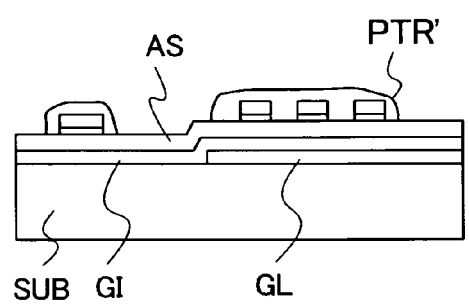
Figure 5C:
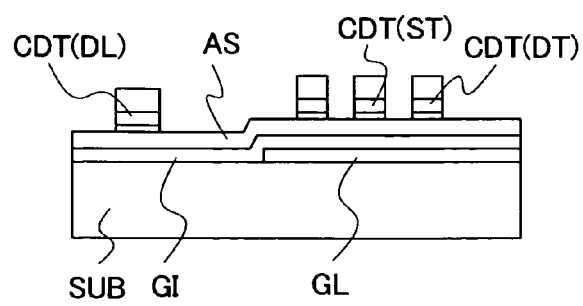

Next, as shown in FIG. 5C, the conductor layer CDT and the high-concentration impurity layer CNL are sequentially etched using the remaining photoresist film PTR as a mask. Here, for example, the conductor layer CDT is etched by so-called wet etching and the high-concentration impurity layer CNL is etched by dry etching.

The remaining conductor layer CDT acquired by selective etching forms the drain electrode DT and the source electrode ST of the thin film transistor TFT, the drain signal line DL connected to the drain electrode DT (including the connecting portion JC with the drain electrode DT), and the pad portion PD of the source electrode ST which is connected with the pixel electrode.

Here, even at a stage in which etching of the conductor layer CDT and the high-concentration impurity layer CNL is finished, the processing advances to the next step without removing the photoresist film PTR.

Next, as shown in FIG. 5D, a deformed photoresist film PTR' is formed by reflowing the photoresist film PTR. The deformed photoresist film PTR' formed by reflowing is formed such that, for example, the photoresist film PTR is exposed to vapor of an organic solvent solution for 1 to 3 minutes thus gradually impregnating the organic solvent solution into the photoresist film PTR whereby the photoresist film PTR is dissolved by the organic solvent solution.

Due to this reflowing, the photoresist film PTR formed above the patterned conductor layer CDT flows and extends, as viewed in a plan view, to the outside of the conductor layer CDT. In other words, the photoresist film PTR flows and protrudes from a profile of the conductor layer CDT.

In this case, when another conductor layer CDT is arranged close to the conductor layer CDT, the photoresist film PTR which flows from the conductor layer CDT and the photoresist film PTR which flows from another conductor layer CDT are merged with each other and hence, a narrow region defined between the conductor layer CDT and another conductor layer CDT is filled with the photoresist film PTR. That is, a portion corresponding to the channel region defined between the drain electrode DT and the source electrode ST is filled with the photoresist film PTR.

Further, the photoresist film PTR' formed by reflowing, as shown in FIG. 4, does not expand to the edge portion of the drain electrode DT formed of the conductor layer CDT and flows in a region of the conductor layer CDT which exhibits more linearity.

Next, as shown in FIG. 5E, using the photoresist film PTR' formed by reflowing as a mask, a portion of the semiconductor layer AS exposed from the mask is selectively etched. Here, a profile of the photoresist film PTR' corresponds to a profile of the semiconductor layer AS (AS') shown in FIG. 1. When the semiconductor layer AS is selectively etched using the photoresist film as a mask, the semiconductor layer AS (AS') is etched as shown in FIG. 1.

Figure 5F:
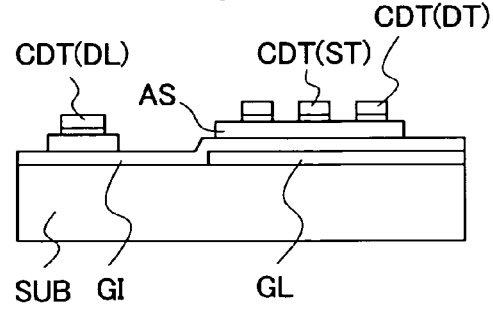

Then, as shown in FIG. 5F, by removing the photoresist film PTR', the formation of the thin film transistor TFT is finished. After the formation of the thin film transistor TFT, the protective film PAS is formed on the surface of the substrate SUB in a state that the protective film PAS covers the thin film transistor TFT, and the pixel electrode PX is formed on an upper surface of the protective film PAS.

Embodiment 2

Figure 6:
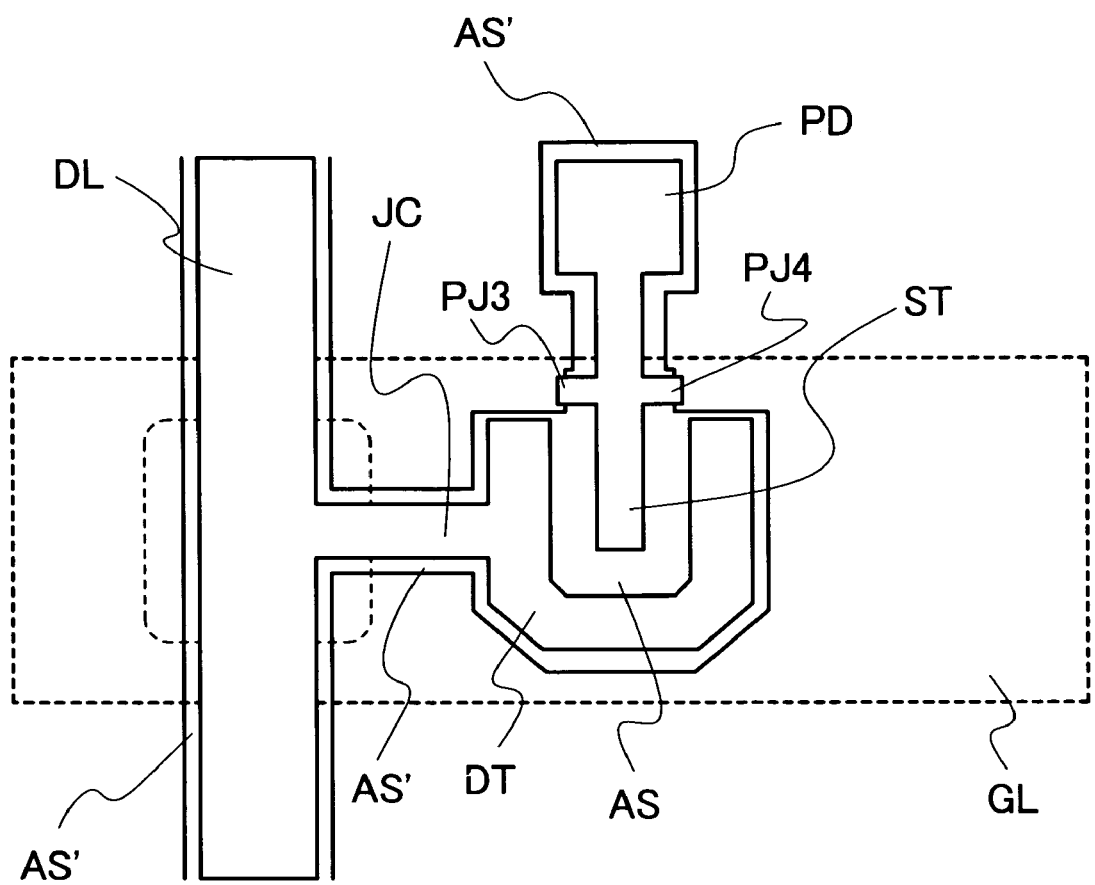
FIG. 6 is a constitutional view of an essential part of a display device according to another embodiment of the present invention.

FIG. 6 is an explanatory view showing another embodiment of the display device according to the present invention and corresponds to FIG. 1.

The constitution which makes this embodiment 2 differ from the embodiment 1 shown in FIG. 1 lies in the constitution of the source electrode ST. That is, on both sides of a portion of the source electrode ST which is positioned between a portion of the source electrode ST which faces the drain electrode DT and the pad portion PD and overlaps the gate signal line GL, projecting portions PJ3, PJ4 are formed.

Due to such a constitution, when the projecting portions PJ3, PJ4 are viewed as distal end portions which project from the conductor layer CDT, a large width portion having a width larger than a width of the distal end portion is formed of the source electrode ST at portions which is arranged close to the distal end portion rearwardly from the distal end portion.

In this manner, the semiconductor layer AS', in the distal end portions of the projecting portions PJ3, PJ4, does not protrude to the outside of profiles of the projecting portions PJ3, PJ4 and rather is constituted in a recessed shape toward the inside of the profile.

Accordingly, it is possible to electrically separate the semiconductor layers AS' which are present on both sides of the projecting portions PJ3, PJ4 as a boundary. Due to such electrical separation, the inflow of a charge stored in the pixel electrode PX not shown in the drawing to the channel region of the thin film transistor TFT via carriers generated in the semiconductor layer AS' below the source electrode ST can be terminated at portions of the projecting portions PJ3, PJ4 thus obviating the generation of a leak current.

Here, in FIG. 6, the connecting portion JC between the drain electrode DT and the drain signal line DL is formed at a position relatively remote from respective ends of the drain electrode DT on the open-ended side, and the projecting portions PJ1, PJ2 shown in FIG. 1 are not formed at positions close to the respective ends. However, it is needless to say that by arranging the respective end portions of the drain electrode DT on the open-ended side at positions shown in FIG. 1, this embodiment 2 can also acquire the advantageous effects acquired by the embodiment 1 shown in FIG. 1.

Embodiment 3

Figure 7:
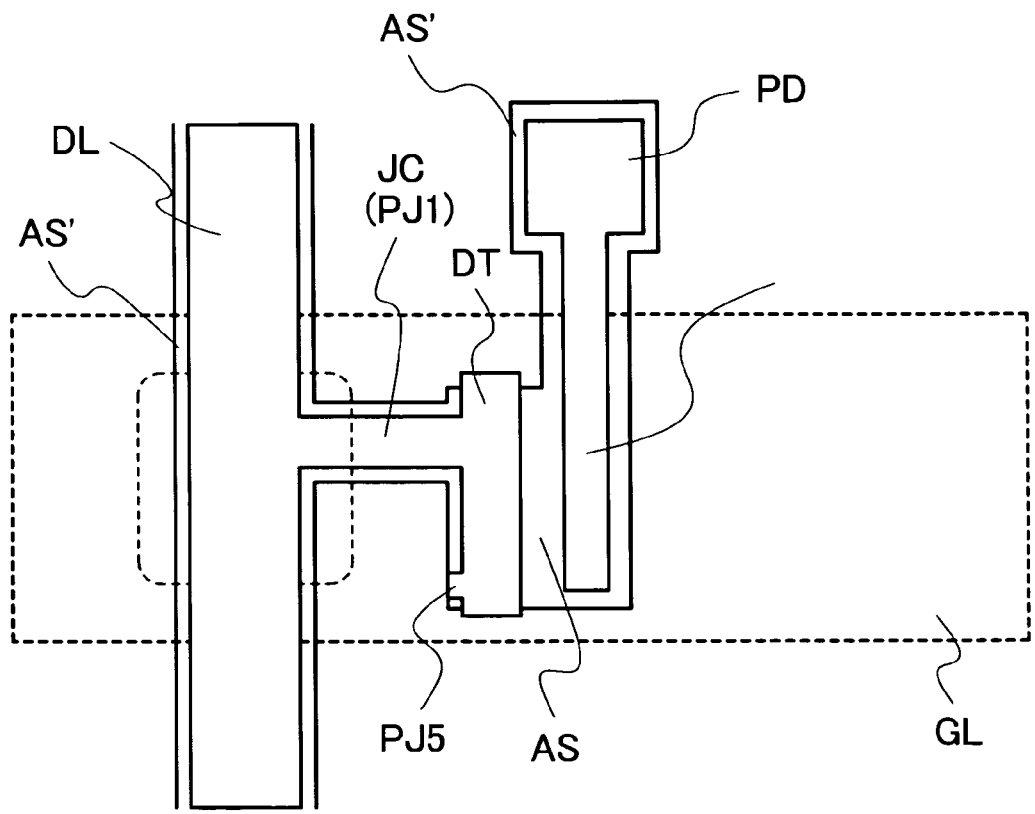
FIG. 7 is a constitutional view of an essential part of the display device according to another embodiment of the present invention.

FIG. 7 is an explanatory view showing another embodiment of the display device according to the present invention and corresponds to FIG. 1.

The constitution which makes this embodiment 3 differ from the embodiment 1 shown in FIG. 1 lies in the constitution of the drain electrode DT. That is, the drain electrode DT is formed in an I shape.

Also in this embodiment, both ends of the drain electrode DT are configured to project outwardly from a profile of the semiconductor layer AS arranged below the drain electrode DT.

That is, a projecting portion PJ1 is formed on one end of the drain electrode DT by forming a connecting potion JC with the drain signal line DL at a position close to one end of the drain electrode DT, and a projecting portion PJ5 is newly formed on another end of the drain electrode DT at a position close to another end.

Here, it is needless to say that, in this embodiment, on the premise of the above-mentioned constitution, the source electrode ST may be configured as shown in FIG. 6. In this case, since the drain electrode DT is positioned only on one side of the source electrode ST, the projecting portion formed on the source electrode ST may be formed on at least a portion of one drain-electrode-DT side thereof.

In the above-mentioned embodiments, the liquid crystal is driven by generating a so-called lateral electric field in the liquid crystal. However, the present invention is not limited to such liquid crystal driving. For example, the present invention is also applicable to liquid crystal driving which generates an electric field in the vertical direction referred to as a vertical electric field, for example.

In the respective embodiments shown in FIG. 1 and FIG. 6, the drain electrode DT is formed in a U shape and the source electrode ST is formed in an I shape. However, even when the source electrode ST is formed in a U shape and the drain electrode DT is formed in an I shape, by setting the relationship between these electrodes reversely, the present invention is applicable to a display device having such relationship.

Although the above-mentioned embodiments adopt a registry flow method, the present invention can acquire the substantially equal advantageous effects even when a half tone exposure technique is used, for example. Further, the display device of the present invention has been explained by taking the liquid crystal display device as an example. However, the present invention is also applicable to other display device such as an organic EL display device. This is because the organic EL display device or the like is also configured by providing a thin film transistor for every pixel and has tasks to be solved substantially equal to the above-mentioned tasks to be solved.

The above-mentioned respective embodiments may be used in a single form or in combination. This is because these embodiments can acquire the advantageous effects of the respective embodiments individually or synergistically.

What is claimed is:

1. A display device comprising a substrate, and a plurality of gate signal line, a plurality of semiconductor layer and a plurality of conductor layer which are sequentially stacked on the substrate, wherein
    the conductor layer forms at least a drain electrode which is connected to a drain signal line and a source electrode which is connected to a pixel electrode,
    the source electrode is formed in a pattern in which the source electrode has a projecting portion at a position where the source electrode overlaps the gate signal line as viewed in a plan view, and
    the semiconductor layer is formed in a pattern in which the semiconductor layer has a protruding portion which protrudes outwardly from the conductor layer at a portion thereof except for a distal end of the projecting portion as viewed in a plan view.

2. The display device according to claim 1, wherein the semiconductor layer is not formed in a protruding manner at least on an edge portion of a distal end of the projecting portion as viewed in a plan view.

3. A display device comprising a substrate, and a plurality of gate signal line, a plurality of semiconductor layer and a plurality of conductor layer which are sequentially stacked on the substrate, wherein
    the conductor layer forms at least a drain electrode which is connected to a drain signal line and a source electrode which is connected to a pixel electrode,
the source electrode is formed in a pattern in which the source electrode has a projecting portion at a position where the source electrode overlaps the gate signal line as viewed in a plan view,
    the drain electrode is formed in a pattern in which the drain electrode has a projecting portion at a portion thereof close to a distal end thereof as viewed in a plan view, and
    the semiconductor layer is formed in a pattern in which the semiconductor layer has a protruding portion which protrudes outwardly from the conductor layer at a portion thereof except for a distal end of the projecting portion of the source electrode and a distal end of the projecting portion of the drain electrode as viewed in a plan view.

4. The display device according to claim 3, wherein the semiconductor layer is not formed in a protruding manner at least on an edge portion of the projecting portion of the drain electrode as viewed in a plan view.

5. The display device according to claim 3, wherein the semiconductor layer is not formed in a protruding manner at least on an edge portion of the projecting portion of the source electrode as viewed in a plan view.

6. The display device according to claim 3, wherein the drain electrode is formed in an approximately U-shaped pattern in which the drain electrode surrounds a distal end portion of the source electrode as viewed in a plan view.

7. The display device according to claim 3, wherein the projecting portion of the drain electrode also functions as a connecting portion between the drain electrode and the drain signal line.

* * * * *